United States Patent [19]
Lenz

[11] Patent Number: 5,237,277
[45] Date of Patent: Aug. 17, 1993

[54] APPARATUS FOR INDIRECT MEASUREMENT AND CONTROL OF A MAGNETIC GRADIENT FIELD IN A NUCLEAR MAGNETIC RESONANCE IMAGING SYSTEM

[75] Inventor: Helmut Lenz, Oberasbach, Fed. Rep. of Germany

[73] Assignee: Siemens Aktiengesellschaft, Munich, Fed. Rep. of Germany

[21] Appl. No.: 713,878

[22] Filed: Jun. 12, 1991

[30] Foreign Application Priority Data

Jun. 25, 1990 [DE] Fed. Rep. of Germany ....... 4020213

[51] Int. Cl.$^5$ ............................................. G01R 33/20
[52] U.S. Cl. ........................................ 324/322; 324/318
[58] Field of Search ............... 324/322, 318, 320, 312; 336/179

[56] References Cited

U.S. PATENT DOCUMENTS

| | | | |
|---|---|---|---|
| 4,437,053 | 3/1984 | Bax | 324/322 |
| 4,703,275 | 10/1987 | Holland | 324/322 |
| 4,864,241 | 9/1989 | Goldie | 324/318 |
| 4,928,063 | 5/1990 | Lampman et al. | 324/320 |
| 5,150,055 | 9/1992 | Kimura et al. | 324/322 |

FOREIGN PATENT DOCUMENTS

| | | | |
|---|---|---|---|
| 0164199 | 12/1985 | European Pat. Off. | 324/318 |
| 3712033 | 10/1988 | Fed. Rep. of Germany | 324/322 |

OTHER PUBLICATIONS

"Grundshaltungen", Beath et al., Electronik 3 pp. 335-354.

*Primary Examiner*—Michael J. Tokar
*Assistant Examiner*—Raymond Y. Mah
*Attorney, Agent, or Firm*—Hill, Steadman & Simpson

[57] ABSTRACT

A nuclear magnetic resonance imaging system has a power supply with a regulator for a gradient coil, the gradient coil generating a gradient magnetic field. Circuitry is provided for measuring changes in the flux density of the gradient magnetic field, and forming an actual value of the flux density from those measurements. The actual value is compared to a predetermined value, and the gradient field is regulated so that the flux density corresponds to the predetermined value.

12 Claims, 3 Drawing Sheets

APPARATUS FOR INDIRECT MEASUREMENT AND CONTROL OF A MAGNETIC GRADIENT FIELD IN A NUCLEAR MAGNETIC RESONANCE IMAGING SYSTEM

BACKGROUND OF THE INVENTION

1. Field of the Invention

The present invention is directed to a nuclear magnetic resonance imaging system, and in particular to an apparatus for indirect measurement and control of a magnetic gradient field thereof.

2. Description of the Prior Art

In nuclear magnetic resonance tomography (NMR or MRI), gradients of magnetic flux density are required in all three directions of a Cartesian coordinate system. These gradients must follow a chronologically predetermined curved shape in all three directions in the measuring volume of the imaging apparatus. This is achieved in known installations using respective coil systems for each spatial coordinate which are each driven (excited) as needed by a power amplifier. At least in part because of the overwhelming magnitude of the static magnetic field in the imaging system, however, the gradients of the magnetic flux density cannot be measured with the required precision at the speed necessary to undertake a direct control of the magnetic flux density for a particular field. Heretofore, therefore, the current flowing through the gradient coil system was regulated. Current regulation, however, is relatively imprecise because the respective shapes of the current curve and the gradient curve deviate from one another as a consequence of eddy currents in the measuring structure. Given changes in the magnetic field, eddy currents flow, for example, in the copper foil of the radio-frequency shielding, in the metal shield of the superconducting magnet used to generate the static field, and in the gradient coil itself.

An approach for enhancing the precision of such control, despite the occurring eddy currents, is disclosed by European Application 0 164 199. As described therein, it is first determined how the gradient field is distorted by the influence of eddy currents, and it is also determined what effect those distortions have on the predetermined current value and on the actual current value, so that the affect of the eddy currents on the gradient field can thereby be compensated.

Because the eddy current influence will vary for each installation, the adjustments which must be made for eddy current compensation, i.e., the necessary setting of the predetermined value and the determination of the actual value of the current, must take place at the installed nuclear magnetic resonance imaging system. Depending upon the experience of the technician, this can be a time-consuming operation. Moreover, complete compensation is usually not possible, because the eddy currents decay with significantly different time constants. Variations in the measuring structure, particularly temperature variations, are similarly not compensated.

A magnetic resonance imaging system is disclosed in German OS 37 12 033 having an actual value measurement system which measures changes in the flux density of a gradient magnetic field, and forms an actual value by integrating these changes. The actual value, after comparison to a predetermined value, can then be used to automatically adjust the gradient field. It is still possible, however, that pronounced deviations in the actual value can occur dependent on the duration of the measuring sequences because of offset disturbances.

SUMMARY OF THE INVENTION

It is an object of the present invention to provide a nuclear magnetic resonance imaging system with means for regulating the gradient magnetic field with which the magnetic flux density of the gradient field can be rapidly and precisely controlled, even given long measuring sequences.

The above object is achieved in accordance with the principles of the present invention in that circuit for acquiring the actual current value is arranged in the circuit of the gradient coil, the circuitry for acquiring the actual value including an integration circuit which integrates changes of the magnetic flux density of the gradient field. The actual value of the current feeding the gradient coil is supplied as a feedback signal to the measuring circuitry, to stabilize the measuring circuitry. It is thus assured that the integrator is stable even given long measuring sequences. No offset deviation occurs, which may otherwise vary in magnitude depending on the duration of the measuring sequence.

In a further embodiment, the actual value acquisition circuitry includes at least one measuring coil disposed in the gradient field. The voltage induced in the coil is a measure of the change of the gradient magnetic field.

In a further embodiment of the invention, the integration circuit functions as a delay element of the first order (P-$T_1$ element) both for the actual value of the change in flux density and for the actual value of current, in that the weightings for the two actual values are different, with the output signal of the integration circuit being formed by the sum of the two delayed and weighted actual values. The weightings for the actual values are selected so that, given a change in the flux density of the gradient magnetic field, the output signal is substantially defined by the actual value of the flux density change, and given a constant flux density, the output signal is substantially defined by the actual value of the current. The output signal at the end of each change in the flux density is made equal to the stationary output signal defined by the actual value of the current. The actual value acquisition circuitry can be constructed in a particularly simple manner using this principle, and in particular a stabilized integration circuit can be achieved with a single operational amplifier.

In a further embodiment, the actual current value acquisition circuitry is connected to the integration circuit via a low-pass filter. The low-pass filter delays the actual value of the current supplied to the integration circuit until the eddy currents produced by the change in the magnetic field have decayed.

In another embodiment of the invention for balancing the weightings of the actual values, a switch is connected in the feedback branch in series with a capacitor. The switch permits the capacitor to be disconnected from the circuit. A switch is also arranged between an inverting circuit and the junction of a feedback resistor with a current-coupling resistor. This switch permits the feedback resistor and the current-coupling resistor to be disconnected from the circuit. These switches permit the gains which determine the actual value weightings to be varied independently of each other, so that the output signal of the actual value acquisition circuitry after a change in the flux density can be made equal to the stationary signal.

In a further embodiment, the actual value acquisition circuitry includes at least two measuring coils which are arranged symmetrically relative to a plane in which the gradient flux density is zero. Measuring errors which arise due to asymmetries in the integration of the gradient coils, or due to movement of the gradient coil, are substantially avoided by using a plurality of measuring coils.

In another embodiment, the measuring coil is (or the measuring coils are) arranged outside of a radio-frequency shielding of the measuring volume. The eddy currents flowing in the radio-frequency shielding, given a change in the gradient current, initially cause an attenuation and displacement of the flux change in the volumen between the gradient coil and the shield. The measuring error caused as a result thereof is substantially diminished if the spacing between the radio-frequency shielding and the measuring coil is maintained small.

A predetermined value filter may be connected between a generator for the predetermined value and the predetermined value input of the field regulator. This filter is advantageous for a number of reasons. First, it additionally allows a slight eddy current compensation. It permits the time constant of the measuring coil, which is defined by the measuring coil inductance, the measuring coil resistance and the input resistance of the integration circuit can be compensated. Lastly, the filter smooths the predetermined value signal, which usually comes from a digital-to-analog converter.

The field regulator may be followed by a current regulator, with the field regulator supplying the predetermined value for the current regulator. As a result of the two regulators connected in sequence, control of the gradient field becomes extremely stable with a high control speed.

In a further embodiment, three power supplies are provided for respectively feeding the three gradient coils, which generate respective gradient fields which are orthogonal. Each power supply includes a field regulator having at least one measuring coil disposed in the respective gradient field, and the actual value acquisition circuitry of each regulator is connected via a high-pass filter to the output of the actual value acquisition circuitry for the other gradient fields. The sum of the signal of the actual value of the gradient field to which the power supply is allocated, and the high-pass-filtered actual value signals from the actual value acquisition circuitry for the other gradient fields is supplied to each regulator as the actual value. Because the gradient fields are orthogonal, the measuring coils must be very precisely aligned in the gradient field so that only the desired gradient is measured by each coil. Any residual coupling which may remain due to component tolerances deviating from precise values is electronically reduced by the use of the high-pass filters with the correct operational sign.

DESCRIPTION OF THE PREFERRED EMBODIMENTS

Figure 1:
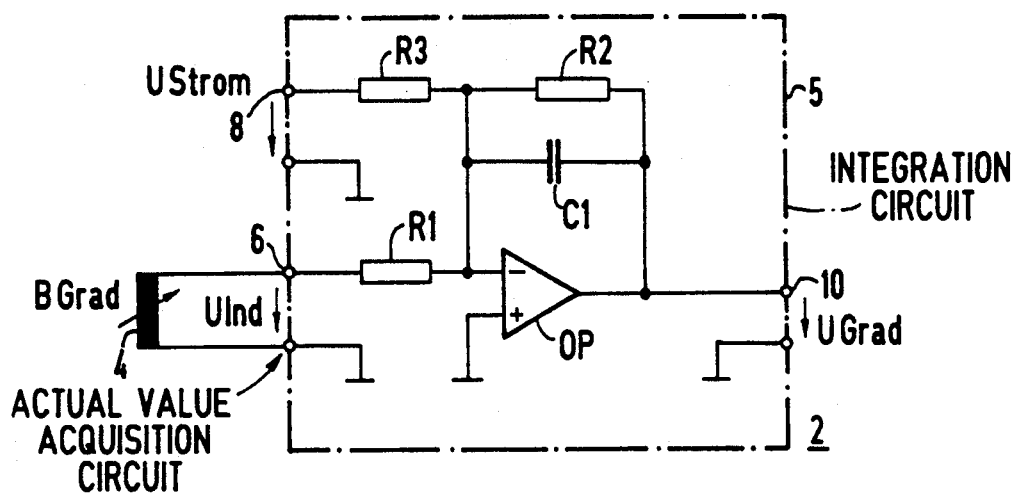
FIG. 1 is a block circuit diagram of an actual value acquisition circuit constructed in accordance with the principles of the present invention.
Figure 7:
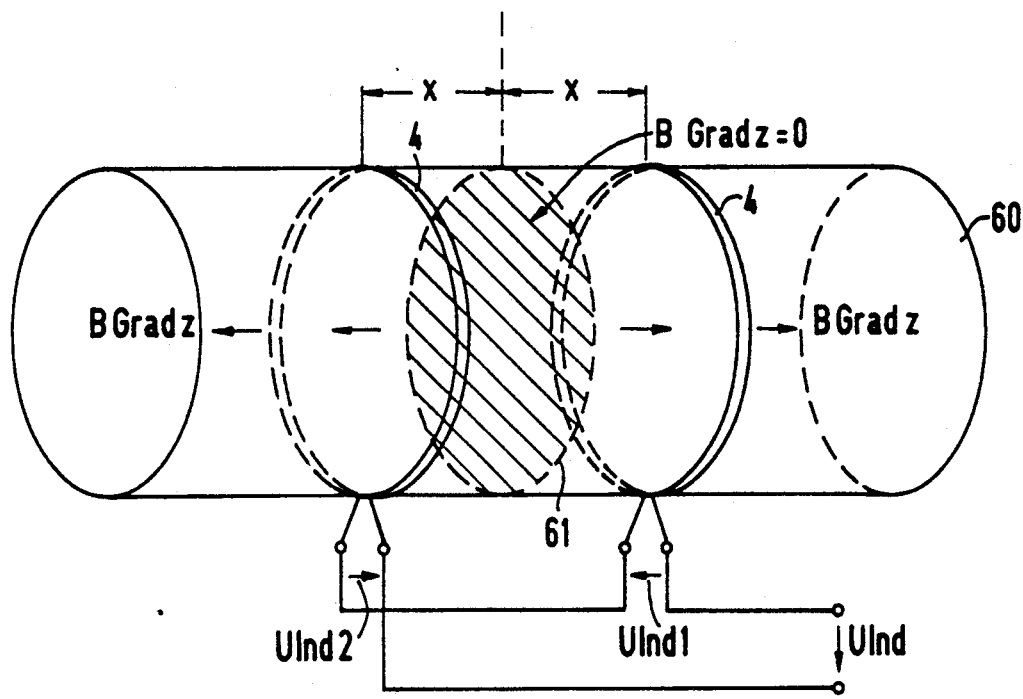
FIG. 7 is a schematic representation of an arrangement of two measuring coils provided for measuring the gradient field in the z-direction constructed in accordance with the principles of the present invention.

The basic structure of an actual value acquisition circuit 2 constructed in accordance with the principles of the present invention is shown in FIG. 1. The actual value acquisition circuit 2 is suitable for measuring the gradient magnetic field in a nuclear magnetic resonance imaging system. For topical resolution, the gradient field is superimposed on a spatially constant, fundamental magnetic field in the x, y and z-directions of a Cartesian coordinate system. The coordinates x, y and z are defined such that the fundamental field is aligned in z-direction. This superimposition can ensue simultaneously or in chronological succession. One or more measuring coils 4 are arranged at suitable locations in the measuring structure for acquiring the changes of the gradient flux density BGrad to be measured. A suitable arrangement using two measuring coils 4 is shown in FIG. 7, described in more detail below, with which changes in the gradient field in z-direction can be measured. Only one measuring coil 4 is shown in FIG. 1 for explaining the operation of the actual value acquisition circuit 2.

The actual value acquisition circuit 2 includes an integration circuit 5 having an operational amplifier OP. The integration circuit 5 has two inputs 6 and 8, and an output 10. Each of the inputs 6 and 8 and the output 10 consists of a terminal pair, with one terminal in each pair being connected to ground.

The other terminal of the input 6 is connected via a resistor R1 to the inverting input of the operational amplifier OP, and the other terminal of the input 8 is connected to this inverting input via a resistor R3. The output of the operational amplifier OP is connected to the other terminal of the output 10. The indirectly calculated actual value of the flux density of the gradient magnetic field UGrad is supplied to the output 10 as an output signal.

A parallel circuit consisting of a capacitor C1 and a resistor R2 is connected between the inverting input and the output of the operational amplifier OP. The input 6 of the integration circuit 5 is connected to the measuring coil 4. The actual value of the change of the gradient field UInd is thus supplied to the input 6. The actual current value UStrom of the current which excites the gradient coil is supplied to the input 8. The integration circuit 5 behaves as a delay element of the first order for both actual values UInd and UStrom. The weightings of the actual values UInd and UStrom, however, are differently selected so that, given a change in the flux density BGrad, the output signal UGrad is essentially defined by the actual value of the flux density change UInd and, given a constant flux density BGrad, the output signal is essentially defined by the actual current value UStrom.

The actual value acquisition circuit 2 forms the actual value for the gradient field UGrad in the manner described below. A voltage UInd is induced in the measuring coil 4 given changes in the magnetic flux density BGrad. This voltage UInd corresponding to the chronological change in the amplitude of the magnetic flux density at the location at which the measuring coil 4 is situated. An representation of the flux density gradient is obtained at the output 10 by integrating the induced voltage UInd. To prevent the integrated signal UGrad from drifting, the actual current value UStrom of the current exciting the gradient coil is supplied to the integration circuit 5 via the input 8. In order for the integration circuit 5 to function as an integrator for the actual value UInd, a time constant T defined by the capacitor C1 and the resistor R2 must be much larger than the signal duration of the actual value UInd, which is in the range of milliseconds. The current which excites the gradient coil after the decay of the eddy currents is a measure for the flux density of the gradient field, so that, after a plurality of time constants T, the actual current value UStrom together with the proportional coefficient R2/R3 defines the output signal UGrad of the integration circuit 5.

The following relationships are significant in the dimensioning of the actual value acquisition 2. The relationship $$UInd = -nd\phi/dt,$$

is valid for the voltage induced in the measuring coil 4, wherein n is the number of turns of the measuring coil 4 and $\phi$ is the flux through the measuring coil 4.

The flux $\phi$ through the measuring coil 4 is defined by the flux density BGrad of the gradient at the location of the measuring coil 4 and the cross-sectional area A of the measuring coil 4. As noted above, UStrom is the actual value of the current exciting the gradient coil. The relationship $$UGrad = -R2(UInd/R1 + UStrom/R3)/(1 + j\omega R2C1)$$

is valid for the output signal UGrad of the actual value acquisition circuit 2, wherein $\omega$ is the radian frequency and j is the designation for an imaginary number.

The maximum gradient Gmax, for example 10 mT/m, is defined by the sensitivity of the gradient coil and by the maximum current through the gradient coil. The output voltage UGradmax should be reached at the output at the maximum gradient Gmax. The flux density BGradmax is dependent on the distance x which defines the distance of the measuring coil 4 from the plane in which BGrad=0. The flux density BGrad through the measuring coil 4 thus is determined by the relationship $$BGrad = x \cdot G.$$

The flux $\phi$ through the measuring coil 4 is derived by the product of the flux density BGrad and the cross-sectional area A of the measuring coil 4. The flux density BGrad is reached proceeding from zero in a time t given the most rapid rise. The highest possible induced voltage is $$UIndmax = n\phi/t.$$

The smallest possible value for the resistor R1 is determined by the maximally induced voltage UIndmax and the maximum possible output current of the operational amplifier OP. The time constant of the measuring coil 4, defined by its inductance L and the resistor R1, must be sufficiently low so that it does not falsify the measurement and does not delay the control. The time constant should be significantly lower than the rise time t of the gradient. The value for the capacitor C1 can therefore be derived from the following relationship:

$$UGradmax = UIndmax \cdot t / R1 \cdot C1.$$

It should be observed that the capacitor C1 should have a high insulating resistance, since the resistor R2 connected in parallel therewith would otherwise be falsified. It will be understood that given a plurality of measuring coils 4 connected in series, the respective inductances L and the respective induced voltages UInd are added.

The value for the resistor R2 should be dimensioned so that the time constant R2C2 is significantly larger than the longest eddy current time constant which is anticipated. For the static condition, the induced voltage UInd will be zero and the maximum flux density BGradmax will be reached at the actual current value UStrommax. The value for the resistor R3 is selected such that $$|UGradmax/UStrommax| = R2/R3.$$

At high frequencies $\omega$, the relationship $\omega R2C1 \gg 1$ is valid. An analysis of the frequency behavior of the circuit of FIG. 1 shows that the relationship $$UGrad = -(UInd/R1 + UStrom/R3) \cdot R2/j\omega 2C1$$

is valid for high frequencies. Because, additionally, the portion of the induced voltage UInd in UGrad increasingly predominates with increasing frequency in comparison to the portion contributed by the actual current value UStrom, the equation for UGrad can be further simplified to $$UGrad = -UInd/j\omega R1C1.$$

This corresponds to the equation of a pure integrator.

Current, gradient and magnetic flux are constant given the frequency $\omega = 0$. Because a flux change no longer occurs, the induced voltage UInd is zero. In the static case, the equation for UGrad is simplified to $$UGrad = -UStrom \cdot R2/R3.$$

Figure 2:
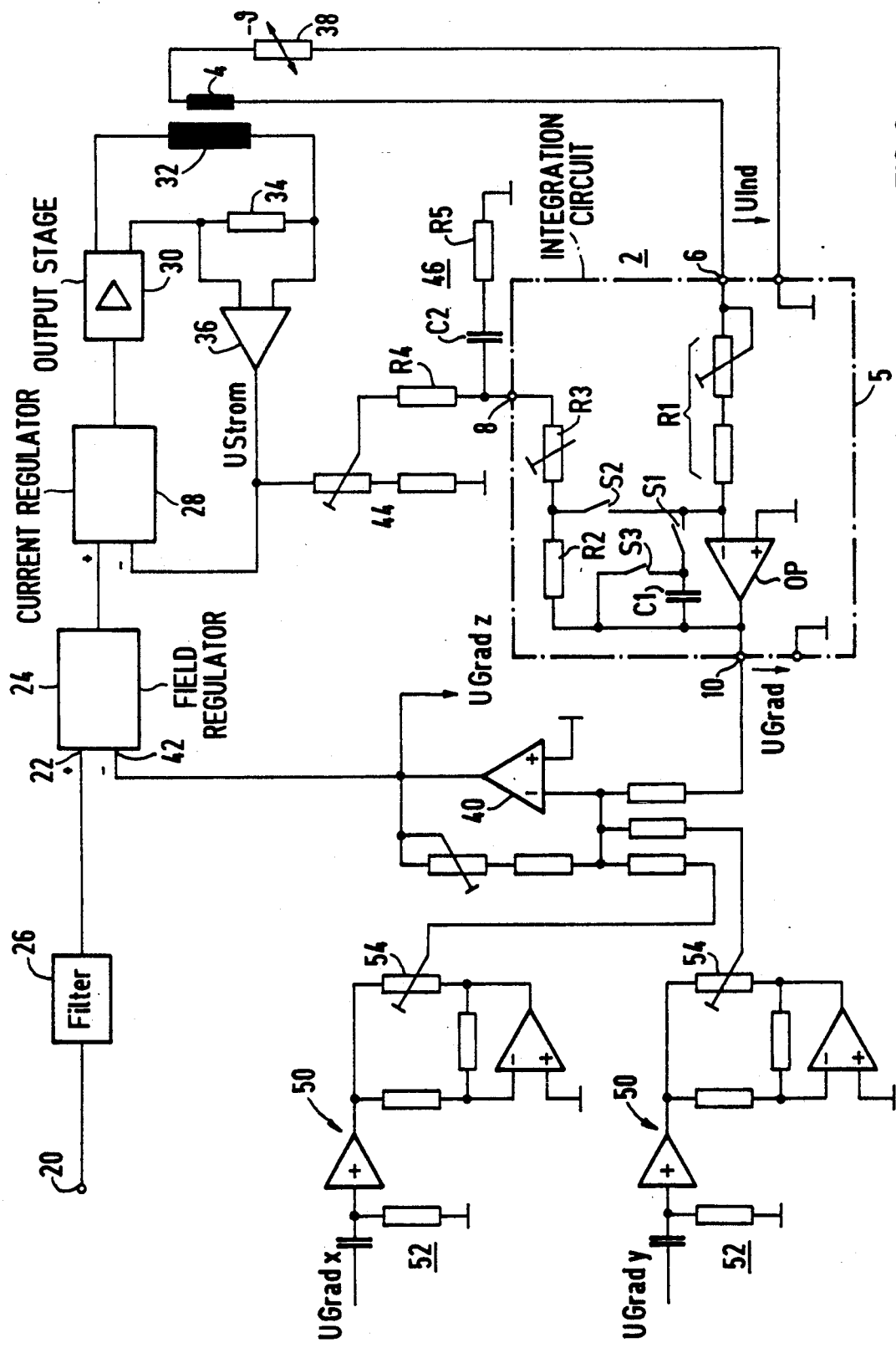
FIG. 2 is a block circuit diagram for a control for the gradient magnetic field constructed in accordance with the principles of the present invention, including the actual value acquisition circuitry.

The complete control circuit for regulating the gradient field is shown in FIG. 2. In this circuit, a filter 26 is arranged between an input 20 of the control circuit, which is connected to a predetermined (rated) value generator (not shown), and the rated value input 22 of a field regulator 24. The filter 26 primarily serves the purpose of smoothing the rated value signal, which usually comes from a digital-to-analog converter. A slight eddy current correction of the rated value can also be simultaneously implemented by the filter 26 so that the time constant of the measuring coil 4 can be compensated.

The field regulator 24 is followed by a current regulator 28, having an output connected to an output stage 30. The output stage 30 is connected to a gradient coil 32. Circuitry for actual value acquisition is formed by a current-acquiring resistor 34 and a differential amplifier 36. The current-acquiring resistor 34 is connected in the circuit of the gradient coil. The differential amplifier 36 serves the purpose of editing the voltage across the current-acquiring resistor 34. The differential amplifier 36 supplies the actual current value UStrom for the current regulator 28 and for the actual value acquisition circuit 2. The measuring coil 4, arranged in the gradient field, is connected to the input 6 of the actual value acquisition circuit 2 via a resistor 38 having a negative temperature coefficient. The resistor 38 compensates temperature-dependent changes in the resistance of the measuring coil 4. The output 10 of the actual current value acquisition circuit 2 is connected to the actual value input 42 of the field regulator 24 via a summing amplifier 40, which serves the purpose of level matching.

A voltage divider 44 followed by a low-pass filter 46 are connected between the output of the differential amplifier 36 and the input 8 of the actual current value acquisition circuit 2. The low-pass filter 46 is formed by a resistor R4 connected to a series branch consisting of a capacitor C2 and a resistor R5. The function of the low-pass filter 46 is described below in connection with FIG. 5, with reference to the signal curve of the actual current value.

Switches S1, S2 and S3, the variable resistors R1 and R3 and the voltage divider 44 serve the purpose, in combination, of balancing and adjusting the actual value acquisition circuit 2. The switch S1 is connected in series with the feedback capacitor C1, and serves the purpose of disconnecting the capacitor C1 from the feedback network. The switch S2 is arranged between the junction of the feedback resistor R2 and the current-coupling resistor R3 and the inverting input of the operational amplifier OP. The resistors R2 and R3 can be disconnected by means of the switch S2. The switch S3 is connected in parallel with the capacitor C1, for discharging the capacitor C1.

The actual value acquisition circuit 2 must be balanced so that a smooth transition between the amplitudes of the dynamic events and the static events is achieved. In a first balancing step, for example, the resistors R2 and R3 are disconnected by the switch S2. The change in the gradient current from zero to a defined current causes a voltage change from zero to UGrad1 after the decay of eddy current effects. The switch S2 is then closed in a second balancing step. The resistors R2 and R3 are thus re-connected in the circuit. At the same time, the switch S1 is opened so that the capacitor C1 is disconnected. In the static condition, the voltage UGrad2 is then obtained at the output 10 from the constant actual current value UStrom. By varying one of the resistors R2 or R3 (the resistor R3 being shown in the drawing as being variable), the voltage UGrad2 is then set equal to the voltage UGrad1. It will be understood that balancing of the circuit can also be achieved by varying the resistor R1 until UGrad1=UGrad2.

The measuring coils 4 must be very precisely aligned to the gradient fields in the x, y and z-directions, so that only the desired gradient appears in the measured signal. Any remaining residual coupling is reduced by feeding the actual values of the two other gradients via respective decoupling networks 50 with the correct operational sign.

As noted above, FIG. 2 shows the control circuit for the gradient field in z-direction. For decoupling, primarily because the actual value acquisition circuit 2 and the regulators 24 and 28 remain active upon activation of the gradient fields in x-direction and y-direction, the actual values UGradx and UGrady of the other gradient fields are supplied to the summing amplifier 40 via the two decoupling networks 50. The signal of the x or y gradient field measured by the measuring coil 4 for the gradient field in z-direction, which is not exactly aligned, is thus compensated.

After high-pass filtering by the high-pass filter 52, the actual values UGradx and UGrady are added to the actual value UGradz. The decoupling can be precisely set using the potentiometer 54, so that the coupling is electronically eliminated in the event that the measuring coil 4 may not be precisely aligned for the actual value UGradz.

Figure 3:
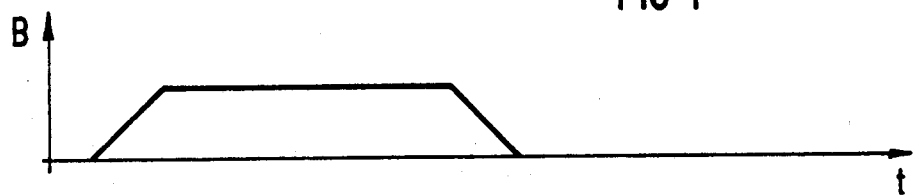
FIG. 3 is a graph showing the chronologically trapezoidal curve of a gradient magnetic field of the type generated in a magnetic resonance imaging apparatus.
Figure 4:
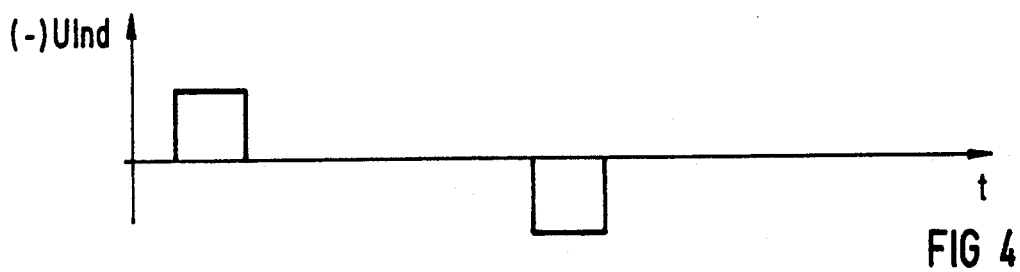
FIG. 4 is a graph showing the voltage induced in a measuring coil of the present invention when the gradient magnetic field changes in the manner shown in FIG. 3.

As an example, FIG. 3 shows the chronological curve of the gradient field. The curve is trapezoidal, and has a rise time on the order of magnitude of milliseconds. Due to the change in flux density, a voltage UInd is induced in the measuring coil 4, the curve of this induced voltage being shown in FIG. 4. Given a constant rise of the flux density of the gradient field, the voltage is constant. A signal occurs only when the gradient field changes.

Figure 5:
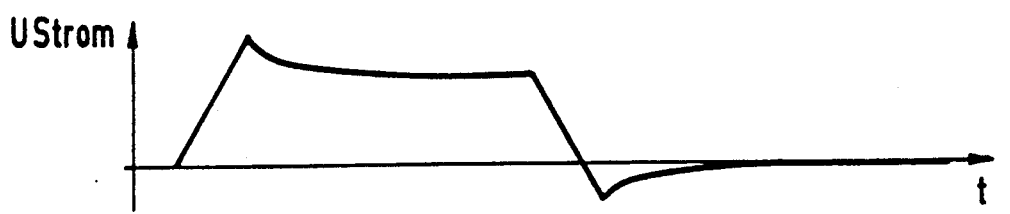
FIG. 5 is a graph showing the voltage occurring at an ammeter resistor contained in the gradient coil circuit when the gradient magnetic field changes as shown in FIG. 3.
Figure 6:
FIG. 6 is a graph showing the actual value of the gradient field formed by the actual value acquisition circuit constructed in accordance with the principles of the present invention when the gradient field changes as shown in FIG. 3.

The actual current value UStrom is shown in FIG. 5, and represents a measure of the excitation current of the gradient coil. As can be seen in FIG. 5, the excitation current of the gradient coil exhibits an increase at the end of each field change. This additional excitation of the gradient coil compensates the attenuation of the gradient field due to eddy currents. In order to suppress these current elevations in the actual value UStrom, the low-pass filter 46 shown in FIG. 2, is connected in the signal path for the actual current value UStrom. By means of the low-pass filter 46, the actual current value is varied in a manner which is the reverse of the variation needed for the eddy current compensation, so that a "decompensation" is achieved. In contrast to the eddy current compensation, however, the potential error is extremely small, and the eddy current time constants and amplitudes which must be taken into account are approximately known, so that a fixed low-pass filter, such as the low-pass filter 46, is sufficient in the signal path for UStrom. Virtually the ideal shape of UGrad, as shown in FIG. 6, can be achieved in this manner.

The spatial arrangement of the measuring coils 4 in a nuclear magnetic resonance imaging system is schematically shown FIG. 7. The gradient field in the z-direction, i.e., the longitudinal direction of the tube 60, should be generated in the interior of the radio-frequency tube 60. The plane in which the gradient field BGradz=0 is shown by the lined area 61. Respective measuring coils 4 are wound around the radio-frequency tube 60 at symmetrical spacings x relative to the zero plane 61. The measuring coils 4 are electrically connected in series and, given a chronological change of the gradient field, generate an output voltage UInd composed of the induced, individual voltages of the coils 4.

Figure 8:
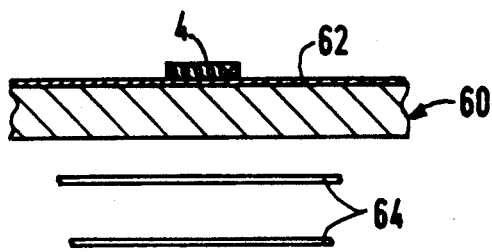
FIG. 8 is a side sectional view, taken transversely through a measuring coil constructed in accordance with the principles of the present invention arranged directly on the radio-frequency shielding.

A cross-section through a measuring coil 4 which is directly wound on the radio-frequency shielding 62 of the radio-frequency tube 60 is shown in FIG. 8. Parts of a radio-frequency resonator 64 are situated in the interior of the tube 60 in the proximity of the measuring coil 4. Because the measuring coils are arranged outside the measuring volume, and thus outside the radio-frequency shielding, measuring errors can occur. The ideal curve of the gradient is no longer established outside of the measuring volume, so that the considerations regarding the calculation of the induced voltage can now only lead to reference values. Because eddy currents flow in the radio-frequency shielding 62, an attenuation and displacement of the flux change in the space between gradient coil and the shield initially occurs given a change in gradient current. The measuring error caused as a result is substantially reduced if the distance between the radio-frequency shielding 62 and the measuring coil 4 is kept small, i.e., it is best if the measuring coils 4 lie directly on the shielding 62. The influence of the attenuation and displacement of the gradient field due to eddy currents can, as needed, be substantially compensated by a corresponding eddy current compensation in the filter 26.

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus for indirect measurement and control of a magnetic gradient field in a nuclear resonance imaging apparatus comprising:
    a gradient coil which generates a gradient magnetic field having a magnetic flux density;
    a power supply connected to said gradient coil including actual value acquisition means for measuring changes in said flux density and forming an actual flux density value from said changes by integration, and means for regulating the flux density of said gradient magnetic field by monitoring deviations of said actual flux density value from a selected value;
    means connected in a circuit including said gradient coil for measuring the actual value of current in said gradient coil and for supplying said actual value of current to said actual value acquisition means; and
    said actual value acquisition means including integration means for acting as a delay element of the first order for both said changes in said flux density and said actual current value, means for differently weighting said flux density change value and said actual current value in said integration means, means in said integration means for forming an output signal of said integration means from the sum of the delayed and differently weighted flux density change value and actual current value with the weightings for said flux density change values and said actual current value being selected so that, given a change in the flux density of said gradient magnetic field, said output signal is substantially defined by the value of the flux density change and, given a constant flux density, said output signal is substantially defined by said actual current value, and means for setting said output signal, at the end of each change of said flux density, equal to a static output signal defined by said actual current value.

2. An apparatus as claimed in claim 1 wherein said actual value acquisition means includes at least one measuring coil disposed in said gradient field.

3. An apparatus as claimed in claim 2 wherein said measuring coil consists of a plurality of windings of copper wire, and further comprising a resistor having a negative temperature coefficient connected to said measuring coil for compensating for the temperature dependency of the copper wire.

4. An apparatus as claimed in claim 1 further comprising a low-pass filter connected between said actual current value acquisition means and said integration means.

5. An apparatus as claimed in claim 1 wherein said actual value acquisition means includes at least one measuring coil disposed in said gradient field, and wherein said integration means comprises;
    an operational amplifier having an inverting input connected to said measuring coil and connected via a current-coupling resistor to said means for measuring the actual value of current; and
    said operational amplifier having feedback path containing a capacitor and a resistor connected in parallel.

6. An apparatus as claimed in claim 5 wherein said integration means further comprises:
    first switch means connected said feedback path in series with said capacitor for disconnecting said capacitor from said feedback path; and
    second switch means connected between said inverting input and a junction of said feedback path with said current-coupling resistor for disconnecting said resistor in said feedback path and said current-coupling resistor.

7. An apparatus as claimed in claim 1 wherein said actual value acquisition means includes at least two measuring coils disposed symmetrically relative to a plane in said gradient magnetic field wherein the gradient flux density is zero.

8. An apparatus as claimed in claim 7 wherein said measuring coils are electrically connected in series.

9. An apparatus as claimed in claim 7 wherein each of said measuring coils consists of a plurality of windings of copper wire, and further comprising, for each measuring coil, a resistor having a negative temperature coefficient connected to the measuring coil for compensating for the temperature dependency of said copper wire.

10. An apparatus as claimed in claim 1 wherein said actual value acquisition means includes a field regulator for comparing said actual flux density value to said selected value, said field regulator having an input to which said selected value is supplied and having a selected value filter preceding said input.

11. An apparatus as claimed in claim 10 further comprising a current regulator having a rated value input connected to an output of said field regulator.

12. An apparatus for indirect measurement and control of magnetic gradient fields in a nuclear magnetic resonance imaging apparatus, comprising:
    three gradient coils which respectively generate three magnetic gradient fields which are orthogonal, each magnetic gradient filed having a magnetic flux density;

three power supplies respectively feeding said three gradient coils;

each power supply including actual value acquisition means, including at least one measuring coil disposed in the magnetic gradient field generated by the gradient coil fed by the power supply, for measuring changes in the flux density of the magnetic gradient field in which said measuring coil is disposed and forming an actual flux density value from said changes by integration, and a field regulator means, having a first input to which a selected value is supplied and a second input, for controlling the flux density of the gradient magnetic field generated by the gradient coil fed by the power supply by monitoring deviations of said actual value from said selected value;

said actual value of said magnetic gradient field generated by the gradient coil fed by the power supply being supplied directly to said second input of said field regulator means, and the respective actual values of the other magnetic gradient fields being supplied to said second input of said field regulator means in each power supply via respective high-pass filters;

means respectively connected in a circuit with each of said gradient coils for measuring the actual value of current in each gradient coil;

respective means, connected to each of said means for measuring the actual value of current, for supplying the actual current value to the actual value acquisition means in the power supply feeding that gradient coil; and each actual value acquisition means in each power supply including integration means for acting as a delay element of the first order for both said changes in said flux density and said actual current value respectively associated with the magnetic field and the coil for that power supply, means for differently weighting said flux density change value and said actual current value in said integration means, means in said integration means for forming an output signal of said integration means from the sum of the delayed and differently weighted flux density change value and actual current value with the weightings for said flux density change values and said actual current value being selected so that, given a change in the flux density of said gradient magnetic field associated with that power supply, said output signal is substantially defined by the value of the flux density change and, given a constant flux density, said output signal is substantially defined by said actual current value, and means for setting said output signal, at the end of each change of said flux density, equal to a static output signal defined by said actual current value.

* * * * *